(12) United States Patent
Mascolo et al.

(10) Patent No.: US 7,945,867 B2
(45) Date of Patent: May 17, 2011

(54) METHOD FOR REALIZING AN ELECTRIC LINKAGE IN A SEMICONDUCTOR ELECTRONIC DEVICE BETWEEN A NANOMETRIC CIRCUIT ARCHITECTURE AND STANDARD ELECTRONIC COMPONENTS

(75) Inventors: Danilo Mascolo, Ercolano (IT); Gianfranco Cerofolini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 629 days.

(21) Appl. No.: 11/971,147

(22) Filed: Jan. 8, 2008

(65) Prior Publication Data
US 2008/0174024 A1    Jul. 24, 2008

Related U.S. Application Data

(63) Continuation-in-part of application No. PCT/EP2006/006676, filed on Jul. 7, 2006.

(30) Foreign Application Priority Data

Jul. 8, 2005  (EP) .................................... 05425488

(51) Int. Cl.
*G06F 17/50* (2006.01)
(52) U.S. Cl. ........................................................ 716/30
(58) Field of Classification Search ................ 716/1, 14, 716/30
See application file for complete search history.

(56) References Cited

U.S. PATENT DOCUMENTS

| | | | |
|---|---|---|---|
| 6,128,214 A | 10/2000 | Kuekes et al. | |
| 6,256,767 B1 | 7/2001 | Kuekes et al. | |
| 6,458,621 B1 | 10/2002 | Beck | |
| 6,699,779 B2 * | 3/2004 | Chen et al. | 438/607 |
| 7,605,066 B2 * | 10/2009 | Cerofolini et al. | 438/584 |

(Continued)

FOREIGN PATENT DOCUMENTS

EP    1341184 A1    9/2003

(Continued)

OTHER PUBLICATIONS

Austin, M., et al., "6 nm Half-Pitch Lines and 0.04 μm² Static Random Access Memory Patterns by Nanoimprint Lithography," *Nanotech.*, 16:1058-1061, May 2005.
Cerofolini, G., et al., "A Hybrid Approach to Nanoelectronics," *Nanotech.*, 16:1040-1047, May 2005.

(Continued)

*Primary Examiner* — Jack Chiang
*Assistant Examiner* — Brandon W Bowers
(74) *Attorney, Agent, or Firm* — Lisa K. Jorgenson; Thomas J. Satagaj; Seed IP Law Group PLLC

(57) ABSTRACT

A method for realizes electric connections in a semiconductor electronic device between a nanometric circuit architecture and standard electronic components. The method includes: providing a nanometric circuit architecture comprising a succession of conductive nanowires substantially parallel to each other and extended along a direction x; realizing, above the succession, an insulating layer; opening, in the insulating layer, a window of nanometric width b extended along a direction inclined by an angle α with respect to the direction x to substantially cross the whole succession of nanowires, with exposure of a succession of exposed portions of the nanowires, one for each nanowire; realizing, above the insulating layer, a plurality of conductive dies extended along a direction y substantially orthogonal to the direction x and addressed towards the standard electronic components, each of such dies overlapping said window onto a respective exposed portion of a nanowire with obtainment of a plurality of contacts realizing said electric connections.

23 Claims, 10 Drawing Sheets

U.S. PATENT DOCUMENTS

| | | |
|---|---|---|
| 2003/0108728 A1 | 6/2003 | Heath et al. |
| 2003/0203585 A1 | 10/2003 | Hsu |
| 2004/0181630 A1 | 9/2004 | Jaiprakash et al. |

FOREIGN PATENT DOCUMENTS

| | | |
|---|---|---|
| EP | 1465201 A2 | 10/2004 |
| WO | 20051029498 A2 | 3/2005 |

OTHER PUBLICATIONS

DeHon, A., et al., "Stochastic Assembly of Sublithographic Nanoscale Interfaces," *IEEE Trans. Of Nanotech.*, 2 (3):165-174, Sep. 2003.

Melosh, N., et al., "Ultrahigh-Density Nanowire Lattices and Circuits," *Science*, 300:112-115, Apr. 2003.

\* cited by examiner

METHOD FOR REALIZING AN ELECTRIC LINKAGE IN A SEMICONDUCTOR ELECTRONIC DEVICE BETWEEN A NANOMETRIC CIRCUIT ARCHITECTURE AND STANDARD ELECTRONIC COMPONENTS

CROSS-REFERENCES TO RELATED APPLICATION

This application claims priority from International Patent Application PCT/EP2006/006676 filed on Jul. 7, 2006, now pending, and from European Patent Application 05425488.3 filed on Jul. 8, 2005, which applications are incorporated herein by reference in their entireties.

BACKGROUND

1. Technical Field

The present invention relates, in its most general aspect, to the field of electronic circuits and in particular to the field of the electronic circuits comprising components of nanometric sizes. More specifically, the present invention relates to a method for realizing, in a circuit of the above type, a plurality of electric contacts between elements of nanometric sizes (nanowires) defining the above circuit architectures of a nano-area, and standard electronic components of a micro-area.

2. Description of the Related Art

In such field, an electronic circuit integrated in a semiconductor device can be schematically represented by one or more micrometric regions, or micro-areas, interacting with one or more nanometric regions or nano-areas.

A micro-area comprises, or is defined by, so called standard electronic components such as, for example, capacitor diodes, MOSFET transistors, address devices, logics and memory devices, micro-contacts, or portions thereof.

The sizes of such standard electronic components, usually micrometric or sub-micrometric, depend, in the last analysis, on the wave-length of the photolithographic source employed in their realization, usually not lower than 90 nm.

A nano-area comprises in turn, or is defined by, circuit architectures of nanometric sizes obtained, for example, by means of electronic lithography (e-beam lithography), with S"PT technique (Multi-Spacer Patterning Technology) or by means of imprint lithography (in all the possible versions: Soft Lithography, Nano-imprint Lithography Step-and-Flash Imprint Lithography and Superlattice Nanowire Pattern).

A nano-area can possibly comprise, moreover, housed in such nanometric circuit architectures, molecular devices realized through chemical synthesis, i.e., molecules able to perform specific functions of mechanical, electric or optic nature.

As it is known, in the electronics field, the need of realizing circuit configurations of more and more reduced sizes is particularly felt.

Actually, the advent of constantly more refined technologies has allowed the miniaturization of the circuit architectures and, in consequence, a greater density thereof in the semiconductor electronic devices.

For example, it has been possible to realize, by means of non-photolithographic techniques, arrays of nanowires having a pitch in the order of a few tens of nanometers (circa 30 nm), or still crossbar architectures of nanowires having a density of intersection points of about $10^{11}$ cm$^{-2}$.

Some examples of such embodiments are reported in the publication by N. A. Melosh, A. Boukai, F. Diana, B. Gerardot, A. Badolato, and J. R. Heath, "Ultra High Density Nanowire Lattices and Circuits", Science 300, 112 (2003), in the publication by M. D. Austin, W. Zhang, H. Ge, D. Wasserman, S. A. Lyon and S. Y. Chou, "6 nm Half-Pitch Lines and 0.04 μm2 Static Random Access Memory Patterns by Nanoimprint Lithography", Nanotechnology, 16 (2005) page 1058-1061, in the U.S. Pat. No. 6,128,214 by P J. Kuekes et al. and in the publication by G F. Cerofolini, G. Arena, C M Camalleri, C. Galati, S. Reina, L. Renna e D. Mascolo "A Hybrid Approach to Nanoelectronics", Nanotechnology 16 (2005) 1040-1047.

However, although currently the capacity to obtain nanometric architectures having the above sizes is widespread, the realization of semiconductor devices comprising such architectures has mainly interested, up to now, the experimental aspect.

The substantial absence of a production of such electronic devices on an industrial scale, is mainly due to the difficulty of relating nanometric architectures to standard electronic components, i.e., of realizing a connection interface between nano-area and micro-area of the electronic device.

Although some methods have been developed for the realization of the above connection, as it is reported, for example, in the U.S. Pat. No. 6,256,767 by Kuekes et al. or still in the publication by A. DeHon, P. Lincoln and J. E. Savagein, "Stochastic Assembly of Sub-Lithographic Nanoscale Interfaces", IEEE Trans. On Nanotec. 2 (3), 165174, (September 2003), such methods are not reliable and industrially profitable.

It would be thus desirable to have a method at disposal for realizing an electric connection between standard electronic components of a micro-area and nanometric electronic components of a nano-area, which is particularly simple, reliable and in line with the currently used technology for realizing circuit configurations of more and more reduced sizes.

Such a method would allow an industrialization on a large scale of high density integrated electronic circuits in a semiconductor substrate.

BRIEF SUMMARY

One embodiment is a method for realizing, in an integrated electronic device of the above considered type, an electric connection between a nanometric circuit architecture and standard electronic components which overcomes the above drawbacks and those still affecting the methods according to the prior art.

The characteristics and the advantages of the method will be apparent from the following description of some embodiments given by way of indicative and non-limiting example with reference to the annexed drawings.

DETAILED DESCRIPTION

Figure 1:
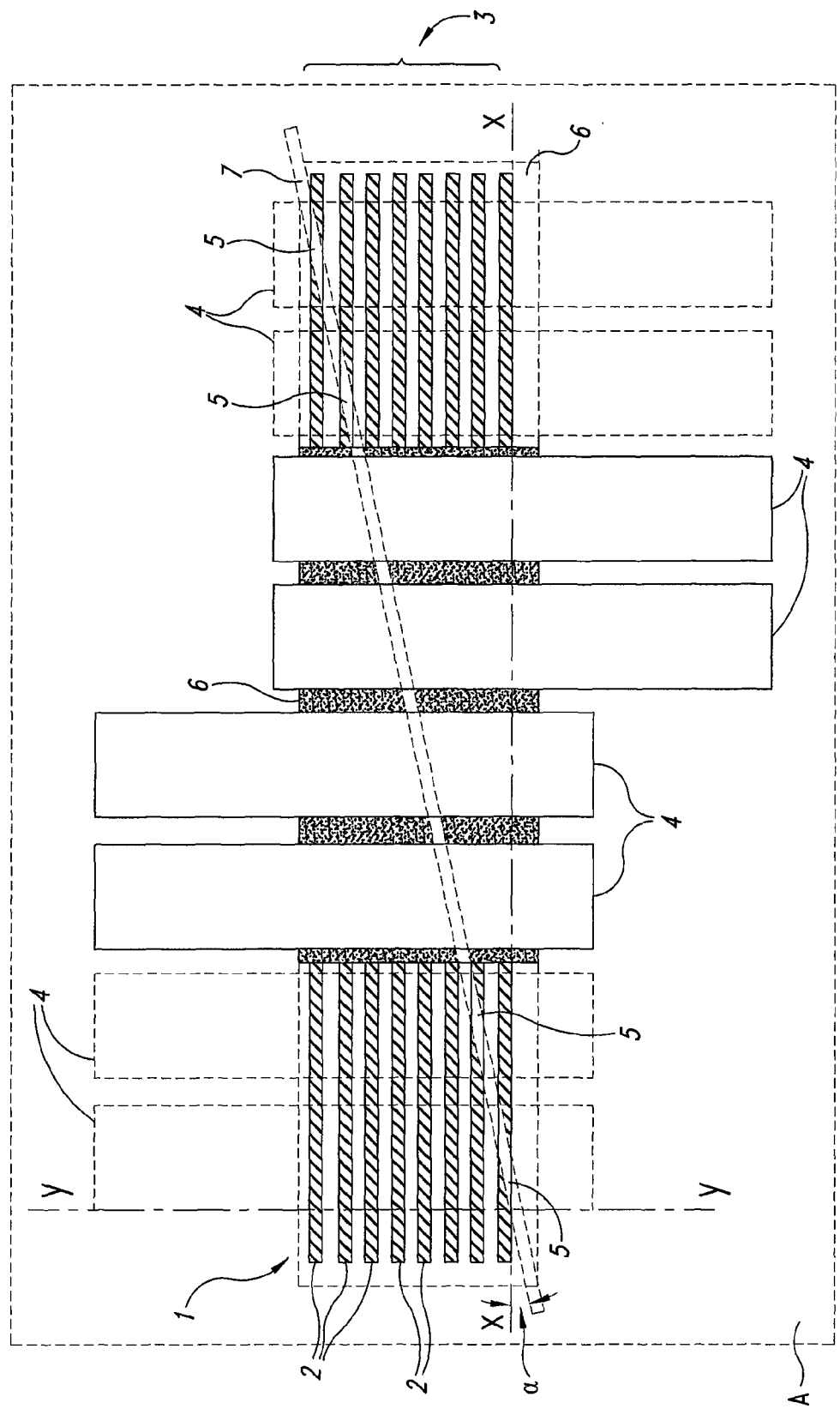
FIG. 1 schematically shows a plan and partially section view of a portion of a semiconductor electronic device comprising an electric connection between a nanometric circuit architecture and standard electronic components.

The here described steps do not form a complete flow of a method for realizing an electric connection in a semiconductor electronic device between a nanometric circuit architecture and standard electronic components and only those steps needed by an average technician of the field for the comprehension of the invention are hereafter described.

It is important to note, moreover, that the figures represent schematic views of portions of an electronic circuit integrated in a semiconductor device during some steps, and they are not drawn to scale, but, on the contrary, realized in such a way as to stress characteristics of some embodiments of the invention.

Various embodiments can be implemented by using several techniques employed in the manufacturing of semiconductor electronic devices, in particular all the lithographic methodologies (optical lithography, UV, EUV, electronic, ionic, imprint) and the Multi-Spacer Patterning Technology (S"PT).

Although known, for greater clarity, the peculiar aspects of the S"PT through which, advantageously, it is possible to realize nanometric circuit architectures with extreme precision and control are hereafter briefly summarized.

In particular it is possible to realize circuit architectures comprising arrays of high density nanowires in the semiconductor device.

The S"PT (reiteration of the Space Patterning Technique SPT) is a technique which allows to transform the thickness of a thin layer of a predetermined material (vertical dimension), deposited on a substrate, into the width of a spacer or more generically of a nanowire, of the same material (horizontal dimension).

Such technique exploits the possibility of controlling, in a more precise way, the thickness of the deposited layer, and exploits the capacity of materials to adapt uniformly to the topography underlying them.

The possibility of transforming a vertical dimension or extension into a horizontal one is allowed by the initial use of a seed, provided with a vertically extended side wall, whereon the material is deposited.

Further to an anisotropic etching of the deposited layer the nanowire, adjacent to the above side wall, is obtained comprising in turn a vertically extended wall which can be employed to obtain a further nanowire.

Finally, the capacity of selectively removing different materials allows to obtain, subsequently to further controlled depositions and anisotropic etchings, variously complex structures.

In practice, it is possible to realize a circuit architecture wherein only one dimension depends on the photolithography, whereas the remaining two dimensions (width and height of the nanowire) are obtained by controlling the thickness of the deposited layer, even within few nanometers.

Deposited layer, as it is known, means a layer obtained both by means of a real controlled deposition of the material, for example with "CVD oxide" (Control Vapor Deposition), and by means of the growth of the material from the underlying layer, for example by means of "Thermal Oxidation".

Now, with reference to FIG. 1, a substrate A of a semiconductor device is shown whereon an integrated circuit is realized.

In particular, on the substrate A there is a nanometric circuit structure 1 comprising a plurality of conductive nanowires 2, substantially parallel to each other, extended along a predetermined direction x and arranged according to an ordered configuration, indicated as array or succession 3 of nanowires 2.

The nanowires 2, advantageously realized by means of the above S"PT technique, have a width $l_y$ comprised between 5 nm and 60 nm, preferably between 5 nm and 30 nm, whereas their succession 3 has a pitch $L_y$ typically lower than 90 nm, preferably comprised in the range 10-50 nm.

It is to be noted that both the width $l_y$ of the nanowires 2 and the pitch $L_y$ of the succession 3, are such as to fall below the limit dimension allowed by photolithography.

The succession 3 of conductive nanowires 2, and more generally the nanometric circuit architecture 1 constitutes, or in any case is part of a so called nano-area in the semiconductor electronic device.

With reference to FIG. 1, 4 indicates a plurality of wires or conductive dies addressed towards standard electronic components of the integrated electronic device, these latter not shown in the figures.

Such dies 4 constitute, or in any case with the above standard electronic components are part of, a so called micro-area of the semiconductor electronic device.

The electric connection between nano-area and micro-area, i.e., between the above nanometric circuit architecture 1 and the standard electronic components is realized by a plurality of electric contact areas, or simply contacts, between the nanowires 2 and the dies 4. Such contacts are indicated in the figures with 5.

Figure 2:
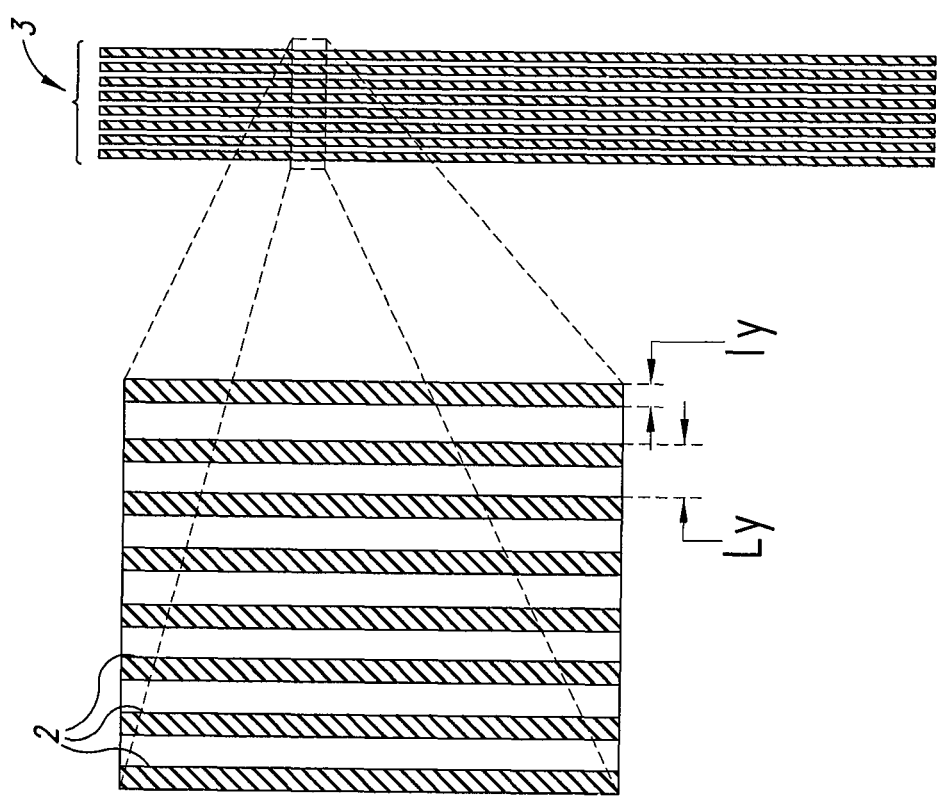
FIGS. 2 to 9 show a portion of a semiconductor electronic device during some steps of a method according to an embodiment with relevant enlarged details, for realizing the electric connection of FIG. 1.
Figure 3:
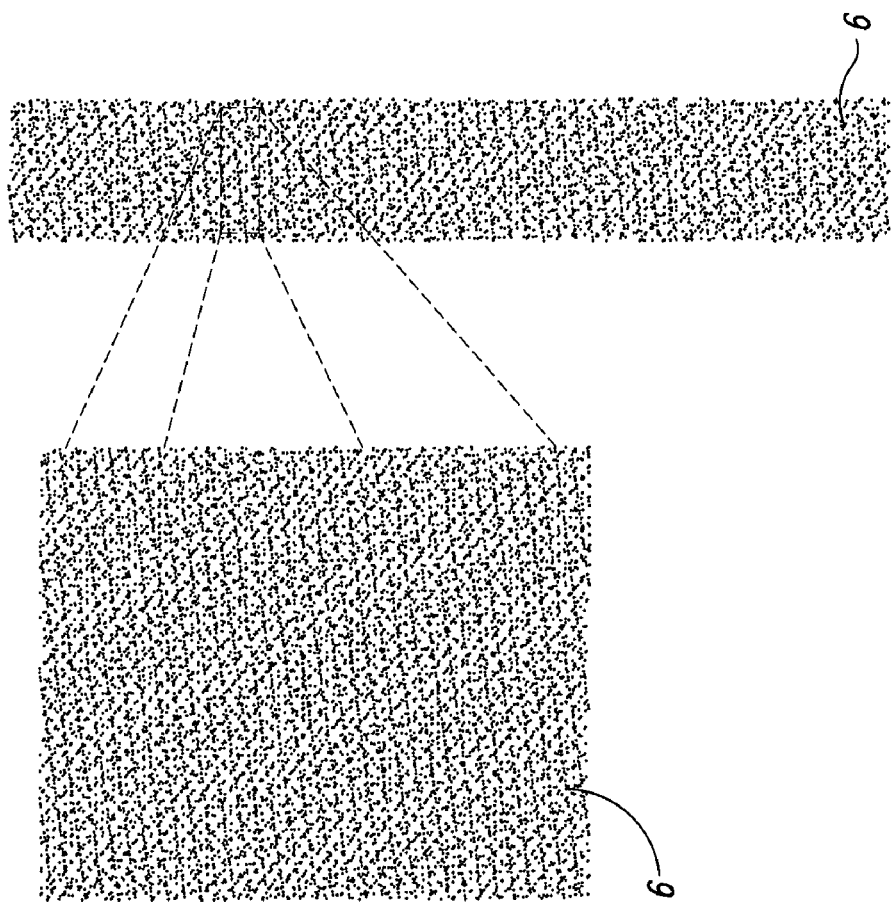

To obtain the contacts 5, the method first provides the realization, above the succession 3 of nanowires 2, of an insulating layer 6, as it is shown with particular reference to the FIGS. 2 and 3.

Such insulating layer 6 is preferably a silicon oxide layer whose thickness is comprised between 1 nm and 100 nm. However, for the realization of such layer also different materials can be employed such as, for example, silicon nitride and similar insulating materials.

The present method thus provides the opening, on the above insulating layer 6, of a window 7 with exposure of portions of each nanowire 2, in the figures indicated with 10.

Figure 4:
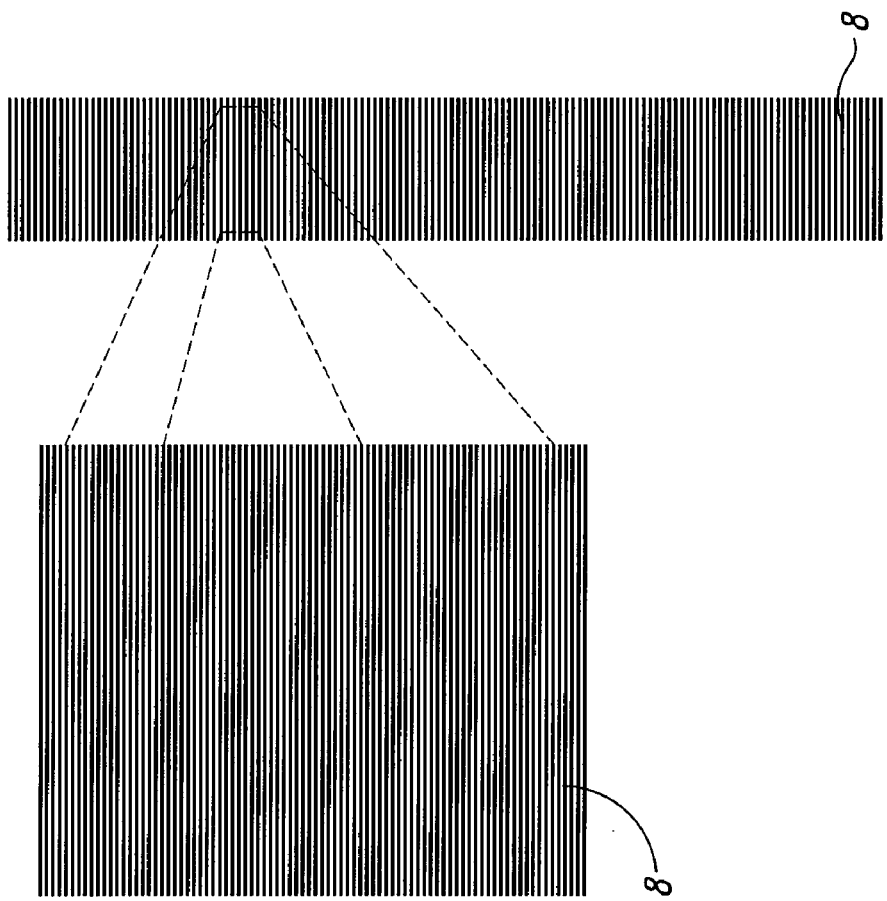

Preferably, for the opening of the above window 7, first a covering layer 8, advantageously a resist layer, which can be seen in the example of FIG. 4, is realized above the insulating layer 6.

At this point in the resist layer 8 a band or stripe 9 is defined, preferably by means of electronic lithography, extended along a direction inclined with respect to the extension direction x of the nanowires of an angle α.

Figure 5:
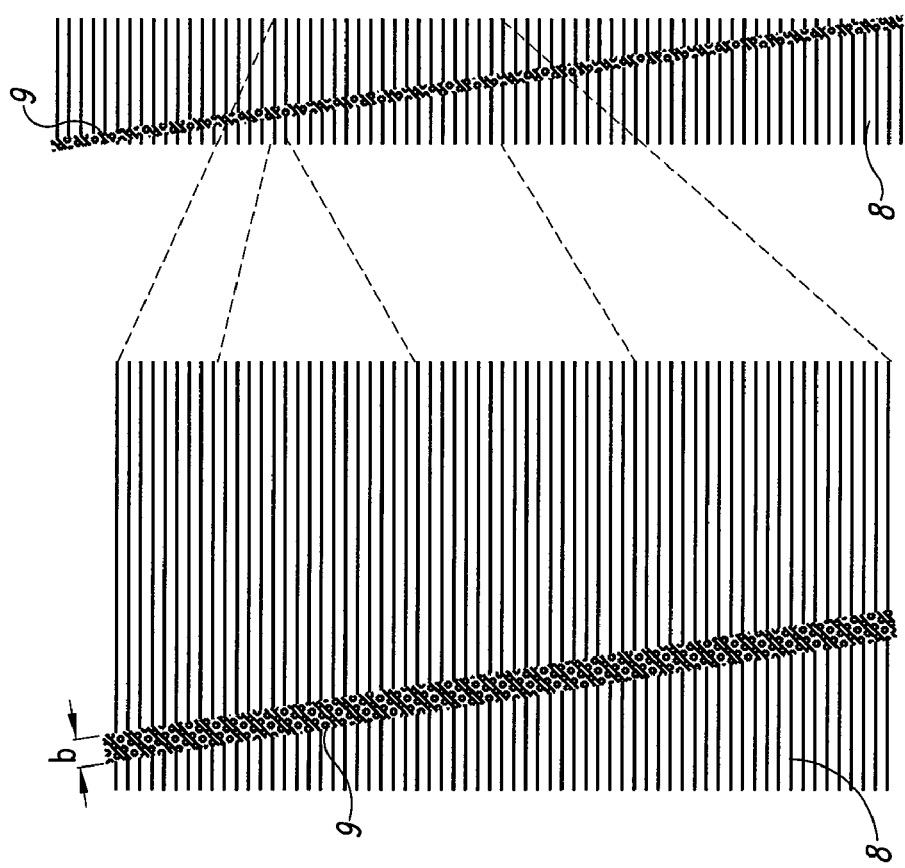

In particular, the stripe 9 is defined with a nanometric width b and with such a length as to substantially cross the whole succession 3 of nanowires 2, as shown in FIG. 5.

As regards the electronic lithography it is worthwhile noting that it refers to a process using a collimated electronic beam to define predetermined geometries on a substrate, in the specific case the resist layer 8.

The hit resist portion changes its own solubility characteristics: exposed negative resists, initially soluble, become insoluble and resistant to the washing in solvents, vice versa initially insoluble positive resists degrade when exposed to the radiation and they become soluble.

Alternatively, the above stripe 9 can be defined in the resist layer 8 by means of imprint lithography.

Figure 6:
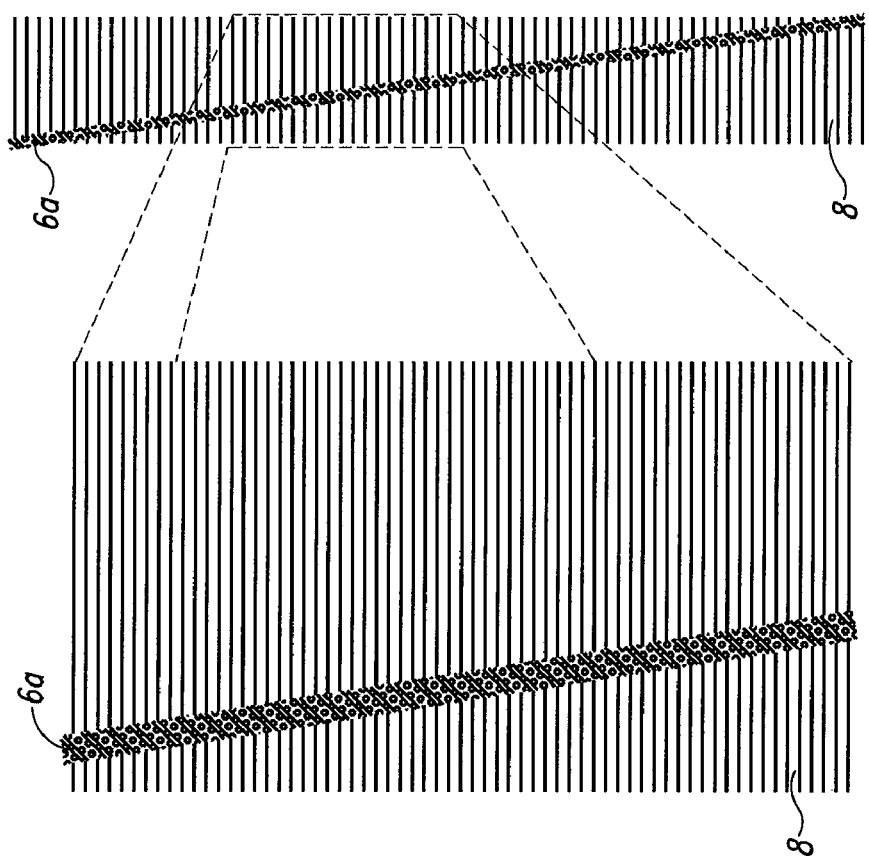
Figure 7:
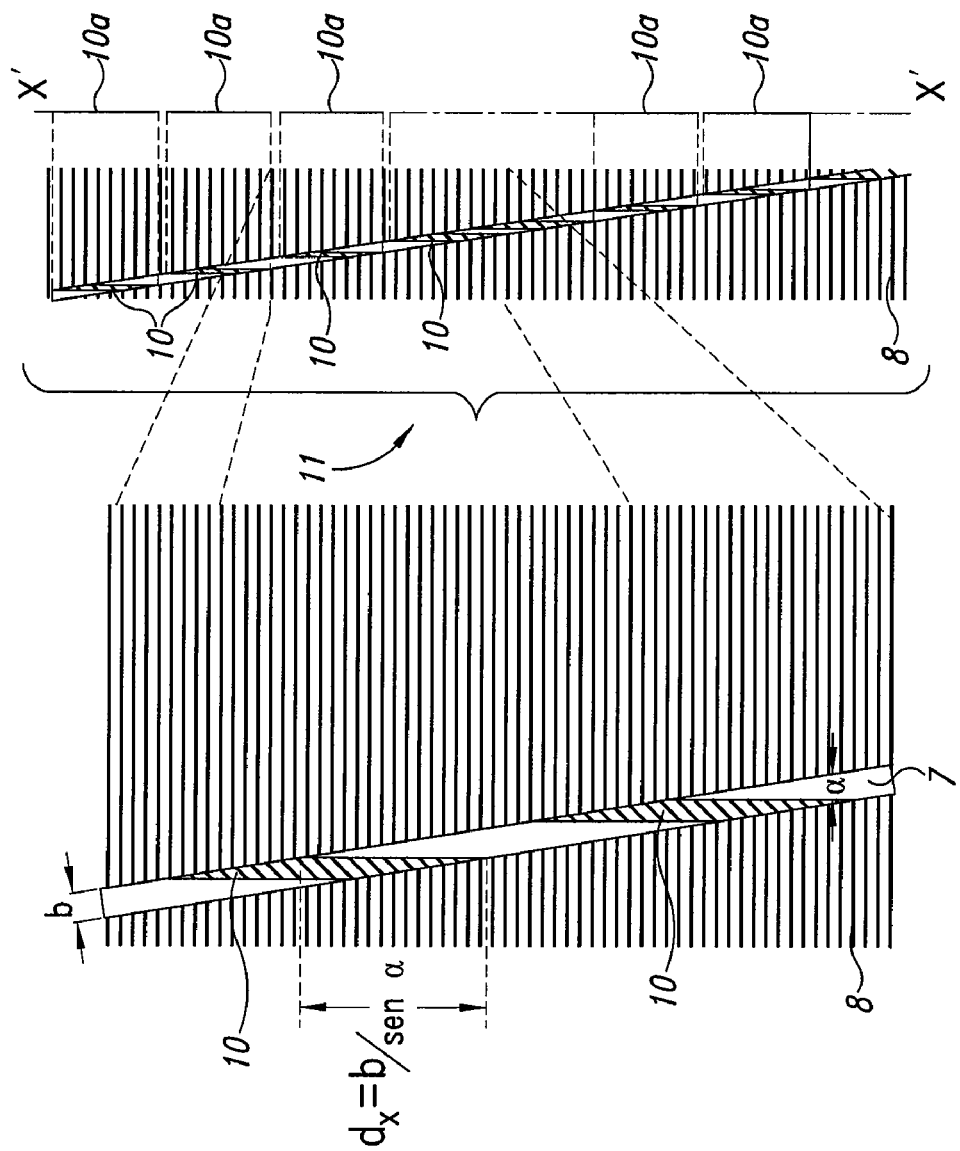

Thus the resist layer 8 is removed, in correspondence with such stripe 9, with exposure of a corresponding band or portion 6a of the underlying insulating layer 6, as it is shown in FIG. 6.

A successive chemical etching removes the insulating layer 6, which is non-masked and protected by the resist 8, i.e., exactly the exposed portion 6a of insulating layer 6, with definition therein of the above window 7.

In particular, the opening of the window 7 on the insulating layer 6 determines the exposure of the above exposed portions 10 of nanowires 2, also arranged according to a succession globally indicated with 11.

It is to be noted that the exposed portions 10 of nanowires 2 have a substantially rhomboidal shape, with greater side $d_x = b/\sen\alpha$, and that the pitch of the succession 11 of such exposed portions 10 is given by the relation $\Delta_x = L_y/\tan\alpha$.

The value of the angle $\alpha$, which determines the inclination of the window 7 with respect to the direction x of the nanowires 2, is chosen according to the pitch of the succession 3 of nanowires 2 and according to the number of conductive nanowires 2 of the succession 3 itself.

In any case it is to be said that, advantageously, the angle $\alpha$ and the above nanometric width b of the stripe 9, thus of the window 7, are chosen in such a way that both the side oriented along the direction x of the exposed portions 10 of the nanowires 2, and the pitch $\Delta_x$ of their succession 11, fall within the limits accessible by means of lithography.

Moreover, the nanometric width b of the stripe 9 and its inclination a are chosen in such a way that exposed portions 10 of the nanowires 2 have respective projections 10a, on an axis x' parallel to the extension direction x of the nanowires 2, which are not overlapped.

Figure 8:
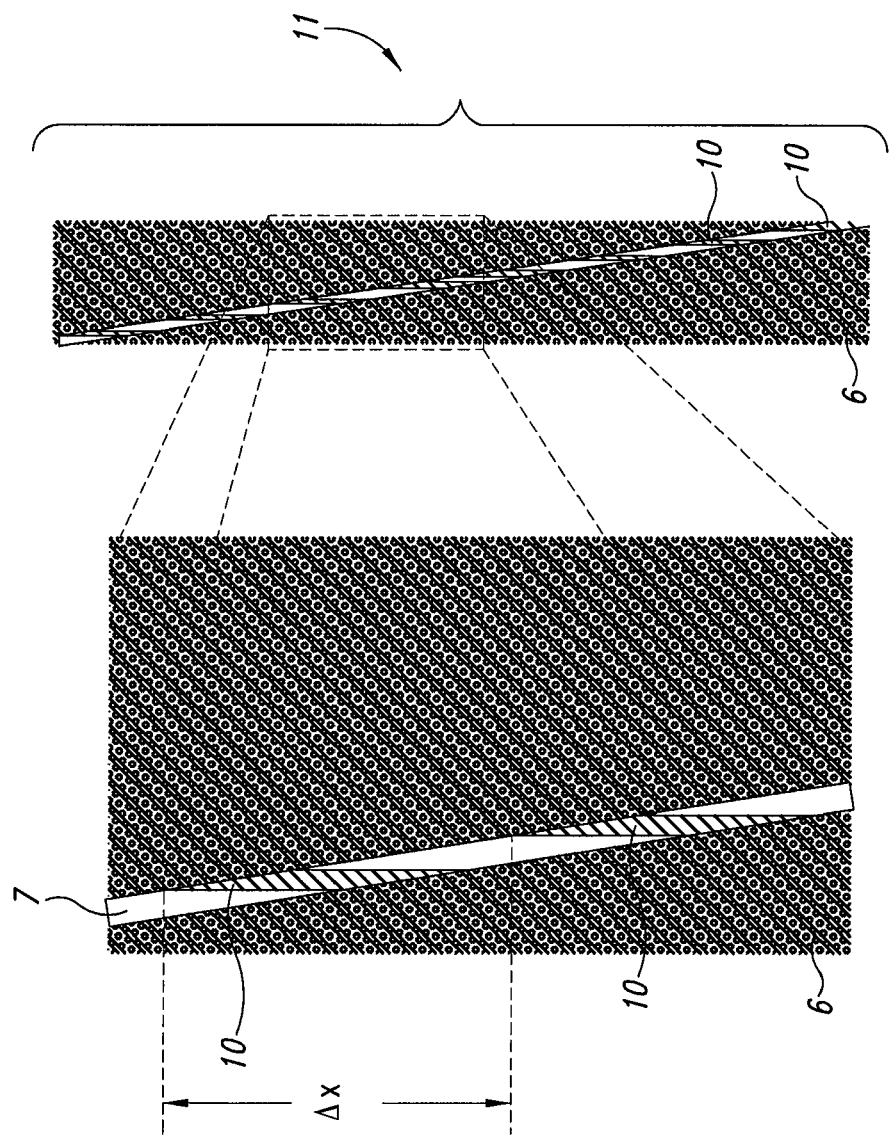

At this point the covering layer 8 is removed, i.e., the remaining resist layer, as shown in FIG. 8; and on the insulating exposed layer 6 the above conductive dies 4 are realized.

Figure 9:
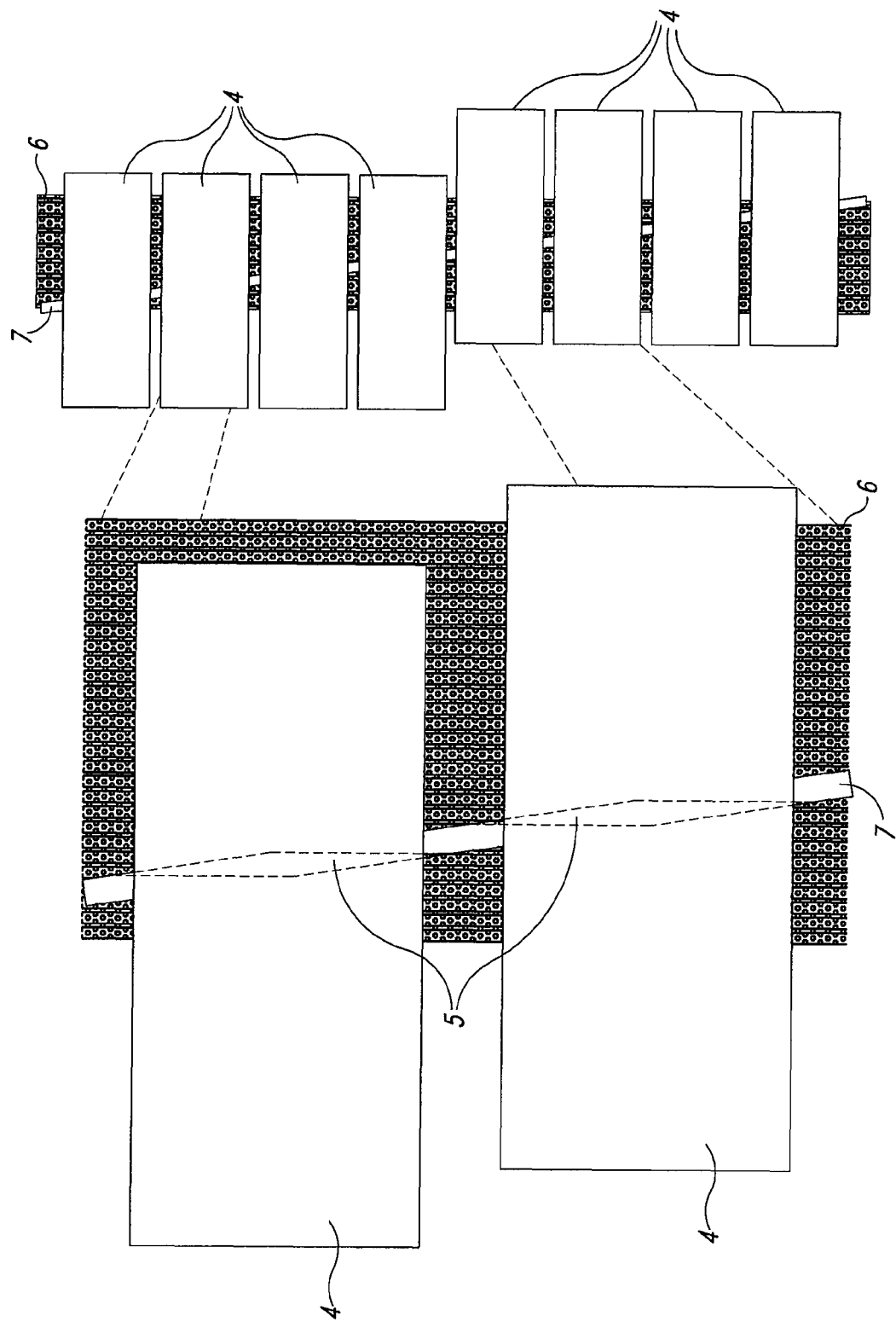

In detail, the dies 4 are realized along a direction y substantially orthogonal to the extension direction x of the nanowires 2, as shown in FIG. 9.

Each die 4 is realized in such a way as to overlap, in correspondence with the window 7, onto a respective exposed portion 10 of a nanowire 2, with obtainment of the above contacts 5, and realization of the desired electric connection between nano-area and micro-area.

Moreover, it is to be said that the dies 4 are advantageously realized according to conventional methodologies by depositing, on the insulating layer 6 whereon the window 7 is open, a layer of conductive material, this latter not shown in the figures, and by defining it by means of photolithography. The conductive material can be doped polysilicon deposited by means of CVD techniques or metal deposited by means of PVD.

In such way each rhomboidal exposed portion 10 of a nanowire 2 is entirely, and selectively, in contact with a corresponding die 4.

With the present method, in practice, an electric connection has been realized between the nano-area and the micro-area of the integrated electronic device, thanks to the conversion of the pitch $L_y$ of the succession 3 of nanowires 2, into the pitch $\Delta_x$ being well greater than the succession 11 of exposed portions 10 of the same nanowires 2, according to the relation $\Delta_x/L_y \approx 1/\alpha(\alpha << 1)$.

Advantageously, the above conversion makes the nanowires 2 singularly and directly accessible for the electric connection with standard electronic components, for example micro-contacts, by means of the currently used techniques in the realization of semiconductor electronic devices, employed to realize the conductive dies 4.

For example, for nanowires 2 having a width $l_y$ comprised between 5 nm and 60 nm arranged in a succession 3 with pitch $L_y$ comprised between 10 nm and 50 nm, the above width b of the window 7 can have values comprised between 5 nm and 30 nm, and its inclination $\alpha$ can have values comprised between degree fractions and some tens of degrees, preferably comprised between 0.1 and 30 degrees.

In such a way a pitch $\Delta_x$ is obtained for the succession 11 of exposed portions 10 of nanowires 2 being sufficiently great as to allow the realization of contacts, for the single nanowires 2, by means of the conventional lithographic techniques.

According to a further embodiment of the invention, the opening of the above window 7 on the insulating layer 6 can be obtained by directly bombing the insulating layer 6 with a ionic beam, according to the technology known as Focused Ionic Beam (FIB), or by employing the S"PT technology.

Figure 10:
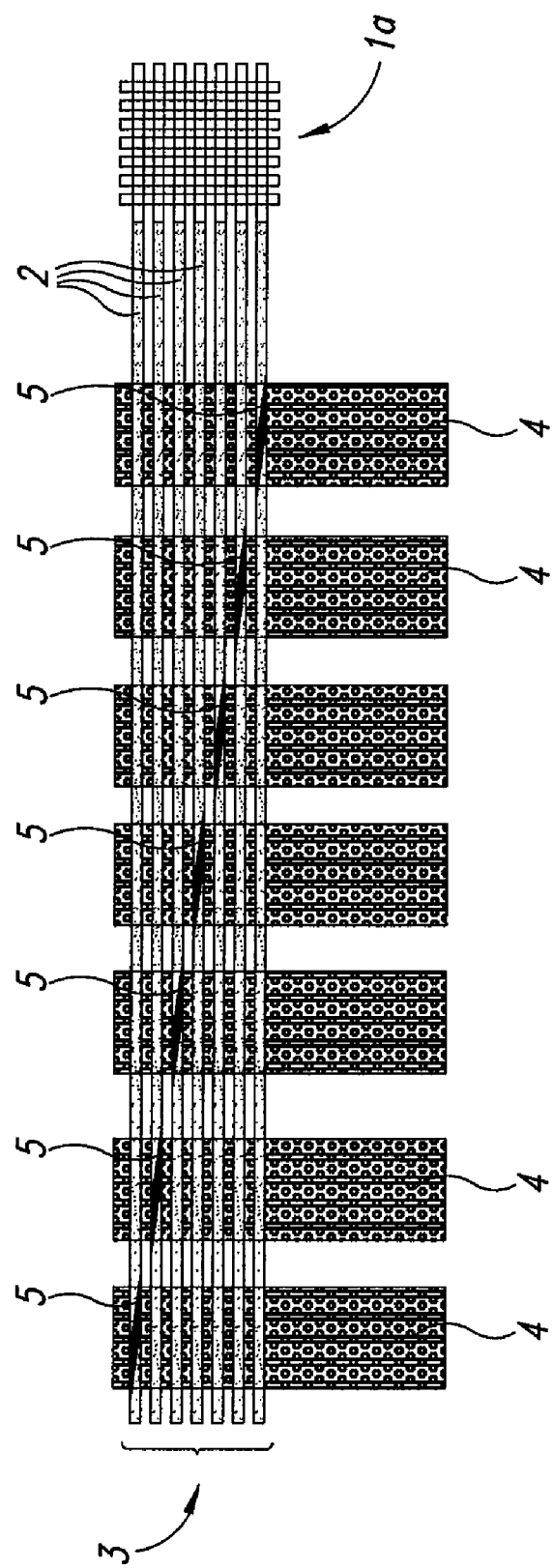
FIG. 10 schematically shows a portion of another embodiment of a semiconductor electronic device comprising an electric connection between a nanometric circuit architecture and standard electronic components.

With reference to FIG. 10 an example of an electric connection between conductive dies 4 and conductive nanowires 2 is shown, wherein the succession 3 of nanowires 2 is part of a nanometric circuit architecture of the so called crossbar type, globally indicated with 1a.

Without entering into details, in the description of such a nanometric architecture, it is useful to note that crossbar circuit architectures are particularly advantageous in the case of the integrated electronic device is of the hybrid type, i.e., in the case wherein the nano-area of the electronic device itself comprises molecular devices.

The main advantage of the method lies in the possibility of selectively contacting conductive nanowires of an array, whose pitch is below the lowest limit attainable by means of photolithography.

Such possibility allows, advantageously, to realize integrated high density electronic devices in a semiconductor substrate.

A further advantage lies in the simple realization of the method, which provides steps being easily integrated in the currently employed productive processes.

Moreover, the present method has revealed to be particularly profitable from the economical point of view.

Obviously, in order to meet contingent and specific requirements, a skilled in the art could bring several modifications to the above described invention, all however comprised within the scope of protection of the invention, as defined by the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
providing a nanometric circuit architecture that includes a succession of conductive nanowires substantially parallel to each other and extended along a direction x;
realizing, above said succession of nanowires, an insulating layer;

exposing a succession of exposed portions of said nanowires, one for each nanowire, by opening, in said insulating layer, a window of nanometric width b extended along a direction inclined by an angle α with respect to the direction x of the nanowires so as to substantially cross the whole succession of nanowires;

realizing, above said insulating layer, a plurality of conductive dies extended along a direction y substantially orthogonal to said direction x, each of said dies overlapping in correspondence with said window onto a respective one of said exposed portions of said nanowires; and forming a plurality of contacts to couple said exposed portions of said nanowires with the conductive dies, respectively.

2. A method according to claim 1, wherein said window in said insulating layer is realized by:
realizing a covering layer on said insulating layer;
defining, on the covering layer, a band having the inclined direction α and the nanometric width b;
obtaining a corresponding exposed portion of the insulating layer by removing the covering layer in correspondence with said band; and
obtaining said window by removing said exposed portion.

3. A method according to claim 2, wherein said covering layer is a resist layer.

4. A method according to claim 3, wherein said band is defined by electronic lithography or imprint lithography.

5. A method according to claim 1, wherein said window in said insulating layer is realized by an S″PT technique or by a focused ionic beam technique.

6. A method according to claim 1, wherein said nanometric width b of the window and said inclination α are chosen in such a way that said exposed portions of nanowires have respective, non-overlapped projections, on an axis x' parallel to the direction x.

7. A method according to claim 1, wherein realizing said conductive dies includes:
depositing a layer of conductive material on said insulating layer wherein said window is open; and
lithographically defining said conductive dies in the layer of conductive material.

8. A method according to claim 7 wherein the contacts are formed by portions of the layer of conductive material extending into the window.

9. A method according to claim 1, wherein said nanowires have a width comprised between 5 nm and 60 nm.

10. A method according to claim 1, wherein said succession of nanowires have a pitch lower than 90 nm.

11. A method according to claim 1, wherein said nanometric width b of said window is comprised between 1 nm and 50 nm, and said inclination α is comprised between 0.1 and 30 degrees.

12. A method according to claim 1, wherein said nanometric circuit architecture is a crossbar circuit architecture.

13. A method, comprising:
providing first and second conductive nanowires substantially parallel to each other and extended along a direction x;
forming an insulating layer above the nanowires;
exposing a first exposed portion of the first nanowire and a second exposed portion of the second nanowire, by opening, in the insulating layer, a window of nanometric width b extended along a direction inclined by an angle α with respect to the direction x of the nanowires so as to cross the first and second conductive nanowires;
realizing, above said insulating layer, first and second conductive dies, the first conductive die overlapping said first exposed portion and the second conductive die overlapping said second exposed portion; and
forming a first contact connecting the first exposed portion to the first conductive die and a second contact connecting the second exposed portion to the second conductive die.

14. The method of claim 13, wherein the window is realized by:
realizing a covering layer on said insulating layer;
defining, on the covering layer, a band having the inclined direction α and the nanometric width b;
obtaining a corresponding exposed portion of the insulating layer by removing the covering layer in correspondence with said band;
obtaining said window by removing said exposed portion.

15. The method of claim 13, wherein the nanometric width b of the window and the inclination α are chosen in such a way that said exposed portions of nanowires have respective, non-overlapped projections, on an axis x' parallel to the direction x.

16. The method of claim 13, wherein realizing said conductive dies includes:
depositing a layer of conductive material on said insulating layer wherein said window is open; and
lithographically defining said conductive dies in the layer of conductive material.

17. The method of claim 16, wherein the contacts are formed by portions of the layer of conductive material extending into the window.

18. A device, comprising:
a nanometric circuit architecture that includes a succession of conductive nanowires substantially parallel to each other and extended along a direction x;
an insulating layer above said succession of nanowires, the insulating layer including a window of nanometric width b extended along a direction inclined by an angle α with respect to the extension direction x of the nanowires so as to substantially cross the whole succession of nanowires, the window exposing a succession of exposed portions of said nanowires, one for each nanowire;
a plurality of conductive dies above said insulating layer, the conductive dies extending along a direction y substantially orthogonal to said direction x, each of said dies overlapping in correspondence with said window onto a respective one of said exposed portions of said nanowires; and
a plurality of contacts respectively connecting said exposed portions of said nanowires with said conductive dies.

19. The device of claim 18, wherein said exposed portions of nanowires have respective, non-overlapped projections, on an axis x' parallel to the direction x.

20. The device of claim 18, wherein said nanowires have a width comprised between 5 nm and 60 nm.

21. The device of claim 18, wherein said succession of nanowires have a pitch lower than 90 nm.

22. The device of claim 18, wherein said nanometric width b of said window is comprised between 1 nm and 50 nm, and said inclination α is comprised between 0.1 and 30 degrees.

23. The device of claim 18 wherein each of said contacts is part of a unitary piece of conductive material that includes a corresponding one of the conductive dies.

* * * * *